(12) United States Patent
Yang et al.

(10) Patent No.: US 6,933,511 B2
(45) Date of Patent: Aug. 23, 2005

(54) ION IMPLANTING APPARATUS

(75) Inventors: Tsun-Neng Yang, Taoyuan (TW);
Tai-Cheng Gunng, Taoyuan (TW);
Wei-Yang Ma, Taoyuan (TW);
Yu-Tang Yang, Taoyuan (TW);
Ming-Ruesy Tsai, Taoyuan (TW);
Kao-Chi Lan, Taoyuan (TW)

(73) Assignee: Atomic Energy Council Institute of Nuclear Energy Research, Lungtan Taoyuan (TW)

( * ) Notice: Subject to any disclaimer, the term of this patent is extended or adjusted under 35 U.S.C. 154(b) by 0 days.

(21) Appl. No.: 10/715,982

(22) Filed: Nov. 18, 2003

(65) Prior Publication Data

US 2005/0104012 A1 May 19, 2005

(51) Int. Cl.$^7$ .............................................. G21K 5/10
(52) U.S. Cl. ............................ 250/492.21; 250/492.3; 250/492.2
(58) Field of Search ..................... 250/492.21, 492.3, 250/492.2, 440.11, 398

(56) References Cited

U.S. PATENT DOCUMENTS

| | | | | |
|---|---|---|---|---|
| 4,534,314 A | * | 8/1985 | Ackley | 118/733 |
| 4,700,077 A | * | 10/1987 | Dykstra et al. | 250/492.2 |
| 4,745,281 A | * | 5/1988 | Enge | 250/396 R |
| 4,831,270 A | * | 5/1989 | Weisenberger | 250/492.2 |
| 4,980,562 A | * | 12/1990 | Berrian et al. | 250/492.2 |
| 5,691,537 A | * | 11/1997 | Chen et al. | 250/251 |
| 6,414,328 B1 | * | 7/2002 | Nussupov | 250/492.21 |
| 6,429,442 B1 | | 8/2002 | Tomita et al. | |
| 6,614,027 B1 | * | 9/2003 | Iwasawa | 250/398 |
| 2002/0079465 A1 | | 6/2002 | Halling | |
| 2003/0001110 A1 | * | 1/2003 | Enge et al. | 250/492.21 |
| 2003/0070316 A1 | | 4/2003 | Weed et al. | |

FOREIGN PATENT DOCUMENTS

| | | |
|---|---|---|
| EP | 385707 | 9/1990 |
| EP | 1035560 | 9/2000 |
| EP | 1037255 | 9/2000 |

* cited by examiner

*Primary Examiner*—Nikita Wells
*Assistant Examiner*—Anthony Quash
(74) *Attorney, Agent, or Firm*—Harrison & Egbert

(57) ABSTRACT

An ion implanting apparatus of has a wafer cassette capable of loading a plurality of wafers, an implanting chamber including an implanting base, a cassette-transferring module for moving the wafer cassette, and a wafer-transferring module for moving the wafer from the wafer cassette to the implanting base. The wafer cassette has a plurality of irradiation trays for loading the wafer, while the implanting base has a guiding slot for guiding the irradiation tray. The cassette-transferring module includes a rack positioned on the wafer cassette, a gear for moving the wafer cassette by driving the rack through rotating, and a first stepping motor for driving the gear. The wafer-transferring module has a push plate for moving the irradiation tray from the wafer cassette to the implanting base, and a second stepping motor for driving the push plate.

7 Claims, 3 Drawing Sheets

ION IMPLANTING APPARATUS

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to an ion implanting apparatus, and more particularly, to a transferring mechanism for an ion implanting apparatus to move a wafer to be implanted.

BACKGROUND OF THE INVENTION

The ion implanting apparatus is used to change the optoelectronic property of the wafer by adding specific dopants therein. The ion implanting apparatus ionizes the dopant to be added into the wafer to form an ionic beam at first. The ion beam is then accelerated up to a predetermined kinetic energy by an electromagnetic lens, and then bombards onto the surface of the wafer. Since the ion beam possesses the predetermined kinetic energy, it will penetrate into the wafer to a certain depth after bombarding the surface of the wafer. Some ions suffer energy losses during the penetration process due to the successive collision with atoms of the wafer continuously. Eventually, the ions stop and are embedded in the clearance of crystal lattices of the wafer, and the dopant is thus called "implanted". In addition, the successive collision between the ions with high energy and the atom arranged in crystal structure of the wafer results in that the original crystal structure with a regular order is disordered due to the different exposure dosage of the ion beam. As a result, the electrical property of certain regions is changed at varying degrees.

The conventional implanting base of the ion implanting apparatus can be mainly divided into two designs. The first design uses a rotating circular base, on which many wafers are positioned. Each wafer receives a uniform ion dosage through the cooperation of the whirling motion of the circular base with the wagging motion of the axle (EP 1035560, EP 1037255, U.S. 2002/079465 and U.S. Pat. No. 6,429,442). The second design uses a fixed implanting base, wherein only a single wafer is implanted in each batch (U.S. 2003/070316 and EP 0385707).

The ion beam and the implanting mechanism can also be divided into two designs. The first design uses an ion beam with a fixed direction, wherein the ion beam irradiates on the surface of the wafer directly, and the implanting base possesses a rotatable mechanism and a wagging mechanism of the axle. For the ion implanting apparatus possesses such a design, the magnetic mirror system for the ion beam is quite simple, but the mechanical design for the implanting base requires a high precision (SEE EP 1035560, EP 1037255, U.S. 2002/079465 and U.S. Pat. No. 6,429,442). The second design uses a scanning ion beam and a fixed implanting base, namely the implanting base does not possess any mechanism for rotating or translational motion (SEE U.S. 2003/070316 and EP 0385707). For the ion implanting apparatus with such a design, the direction of the scanning ion beam is not perpendicular to the surface of the wafer.

BRIEF SUMMARY OF THE INVENTION

The objective of the present invention is to provide a transferring mechanism for an ion implanting apparatus to move a wafer to be implanted.

Another objective of the present invention is to provide an ion implanting apparatus, which can adjust the direction of the ion beam to be perpendicular to the surface of the wafer to eliminate the slanting irradiation and the irradiation shadow originating from the divergent angle of the ion beam.

In order to achieve the above-mentioned objectives, and avoid the problems of the prior art, the present invention provides an ion implanting apparatus. The ion implanting apparatus comprises a wafer cassette capable of loading a plurality of wafers, an implanting chamber including an implanting base, a cassette-transferring module for moving the wafer cassette, and a wafer-transferring module for moving the wafer from the wafer cassette to the implanting base. The wafer cassette comprises a plurality of irradiation tray for loading the wafer, while the implanting base comprises a guiding slot for guiding the irradiation tray. The cassette-transferring module comprises a rack positioned on the wafer cassette, a gear for moving the wafer cassette by driving the rack through rotation, and a first stepping motor for driving the gear. The wafer-transferring module comprises a push plate for moving the irradiation tray from the wafer cassette to the implanting base, and a second stepping motor for driving the push plate.

According to the present invention, the ion implanting apparatus comprises an ion generator, a mass analysis magnet positioned between the implanting chamber and the ion generator, a first multipole moment magnet positioned between the mass analysis magnet and the implanting chamber, a deflection board positioned between the first multipole moment magnet and the implanting chamber, and a second multipole moment magnet positioned between the deflection board and the implanting chamber. The second multipole moment magnet can generate a magnetic field with aggregating action. The magnetic field can control the direction of the ion beam without changing the velocity of the ion beam. Therefore, the second multipole moment magnet can adjust the direction of the ion beam to be perpendicular to the surface of the wafer to eliminate the slanting irradiation and the irradiation shadow originating from the divergent angle of the ion beam.

Compared with the prior art, the present invention possesses the following advantages:

1. The ion implanting apparatus of the present invention makes the ion beam perpendicular to the surface of the wafer by making use of the second multipole moment magnet, so that the purpose of uniform implanting can be achieved by eliminating the slanting irradiation and the irradiation shadow originating from the divergent angle of the ion beam.
2. With the design of the wafer cassette, the cassette-transferring module and the wafer-transferring module, the ion implanting apparatus of the present invention can cooperate with a computer system to fulfill an automatic ion implanting.
3. The number of wafers implanted in a single batch depends on the capacity of the wafer cassette, rather than the size of the implanting chamber, and therefore the size of the implanting chamber for the present ion implanting apparatus can be designed to be smaller as compared with the prior art. In addition, the design for both the cassette-transferring module and the wafer-transferring module is also simpler as compared with the prior art.

BRIEF DESCRIPTION OF THE SEVERAL VIEWS OF THE DRAWINGS

Other objectives and advantages of the present invention will become apparent upon reading the following descriptions and upon reference to the accompanying drawings.

DETAILED DESCRIPTION OF THE INVENTION

Figure 1:
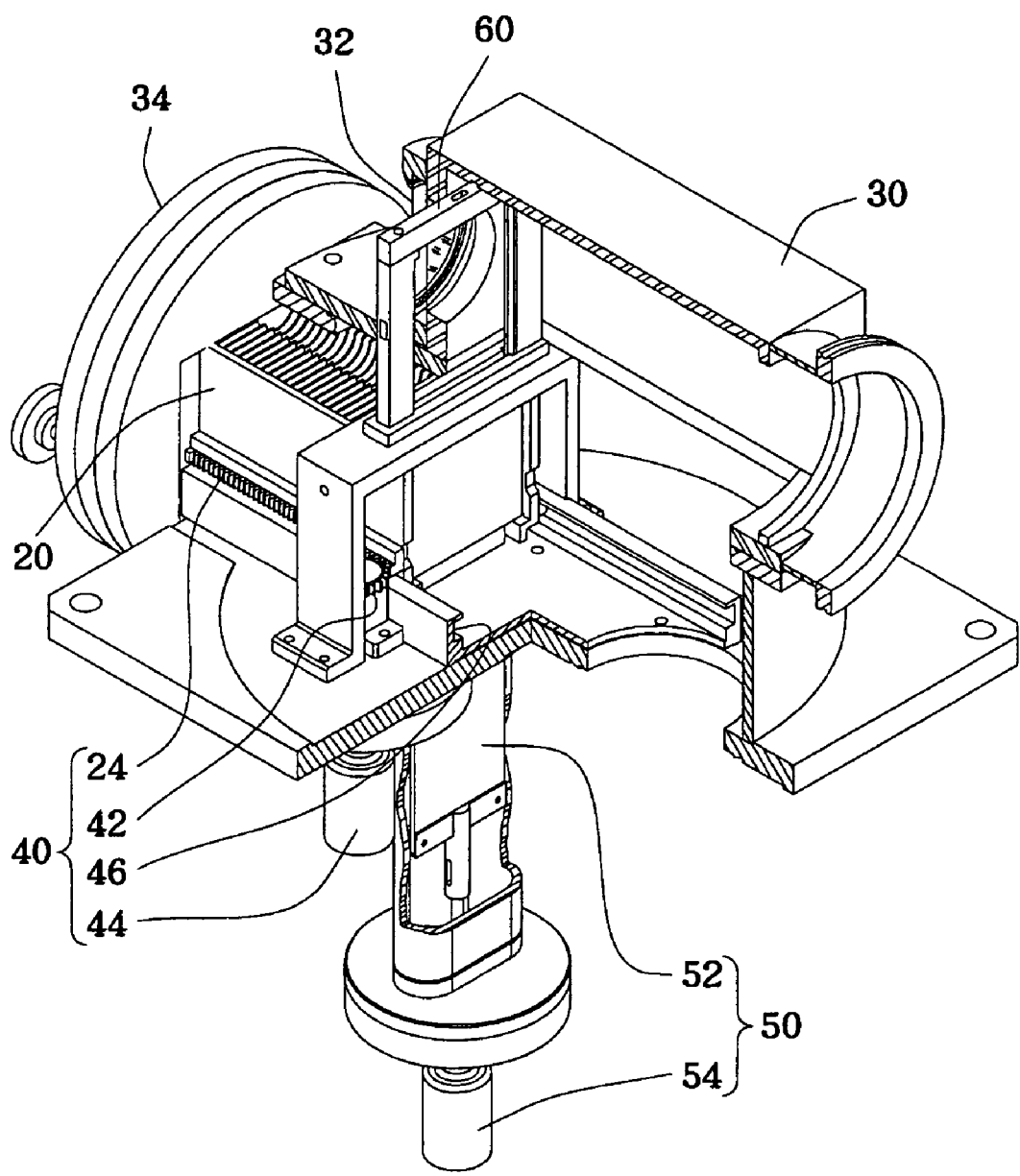
FIG. 1 and FIG. 2 are cross-sectional and perspective views showing a portion of an ion implanting apparatus according to the present invention.
Figure 2:
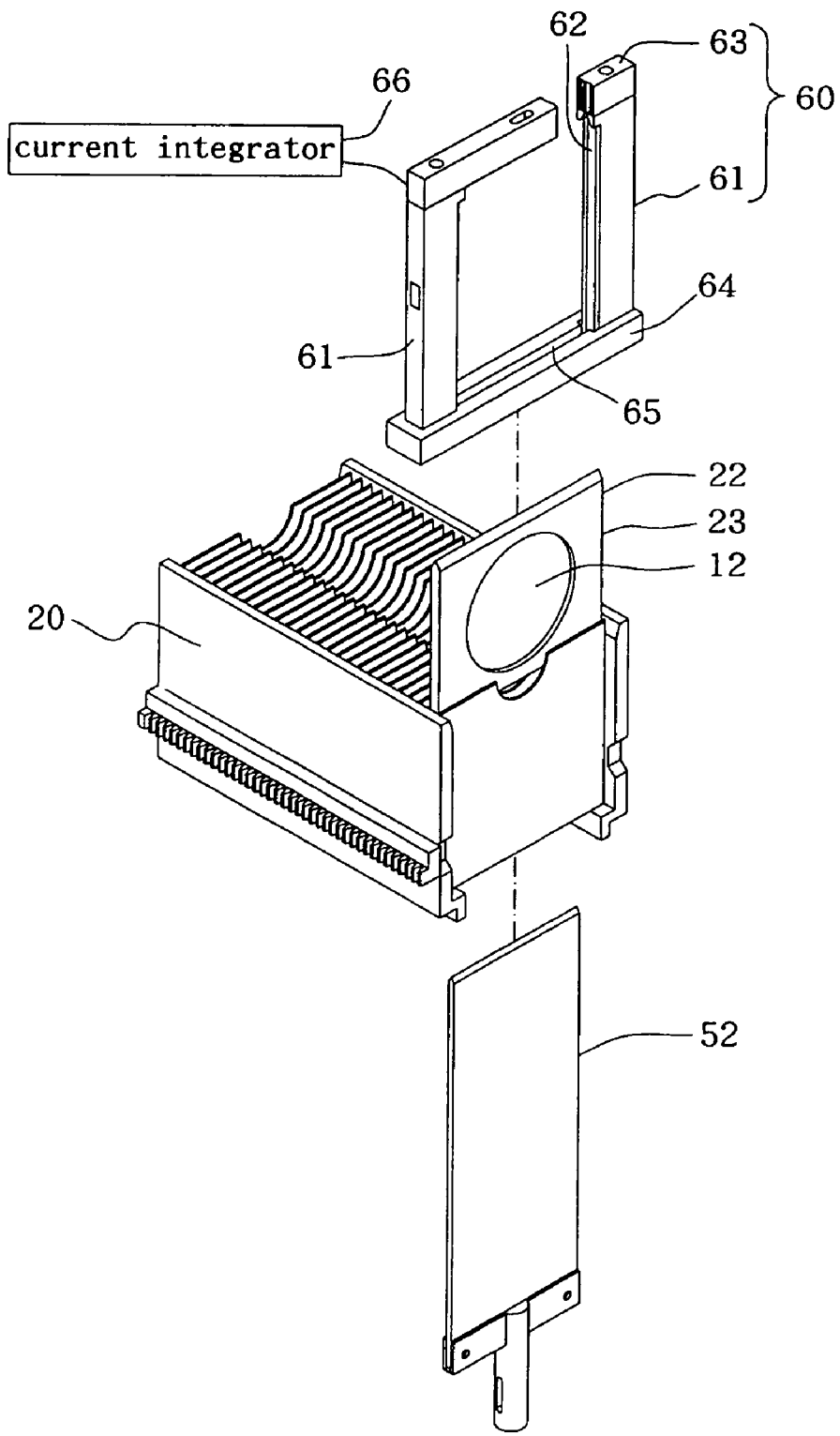

FIG. 1 and FIG. 2 show a portion of an ion implanting apparatus 10 according to the present invention. The ion implanting apparatus 10 comprises a wafer cassette 20, an implanting chamber 30 including an implanting base 60, a cassette-transferring module 40 for moving the wafer cassette 20, and a wafer-transferring module 50 for moving the wafer 12 from the wafer cassette 20 to the implanting base 60.

The wafer cassette 20 comprises a plurality of irradiation trays 22, and each irradiation tray 22 can load a piece of wafer 12. The implanting base 60 comprises a guiding slot 62 for guiding the irradiation tray 22. The ion implanting apparatus 10 can further comprises an insulative sleeve 64 with a guiding slot 65 allowing the irradiation trays 22 to pass through and a current integrator 66 electrically connected to the implanting base 60. The implanting base 60 comprises two guiding pillars 61 with a guiding trench 62 for guiding the irradiation tray 22 and a top beam 63 connected to the two pillars 61, wherein the guiding pillars 61 are positioned at two sides of the guiding slot 65, respectively. The implanting base 60 is positioned on the isolative sleeve 64 to be insulated from other components in the implanting chamber 30. Consequently, the electric current generated by all ions irradiated onto the wafer 12 can be conducted to the current integrator 66, and the ion implanting dosage of the wafer 12 can be calculated by the integration of the electric current with the implanting time.

The cassette-transferring module 40 comprises a rack 24 positioned on the wafer cassette 20, a gear 42 for moving the wafer cassette 20 by driving the rack 24 through rotation, a first stepping motor 44 for driving the gear 42, and a guiding chute 46 for guiding the moving direction of the wafer cassette 20. The wafer-transferring module 50 comprises a push plate 52 for moving the irradiation tray 22 from the wafer cassette 20 to the implanting base 60, and a second stepping motor 54 for driving the push plate 52.

Figure 3:
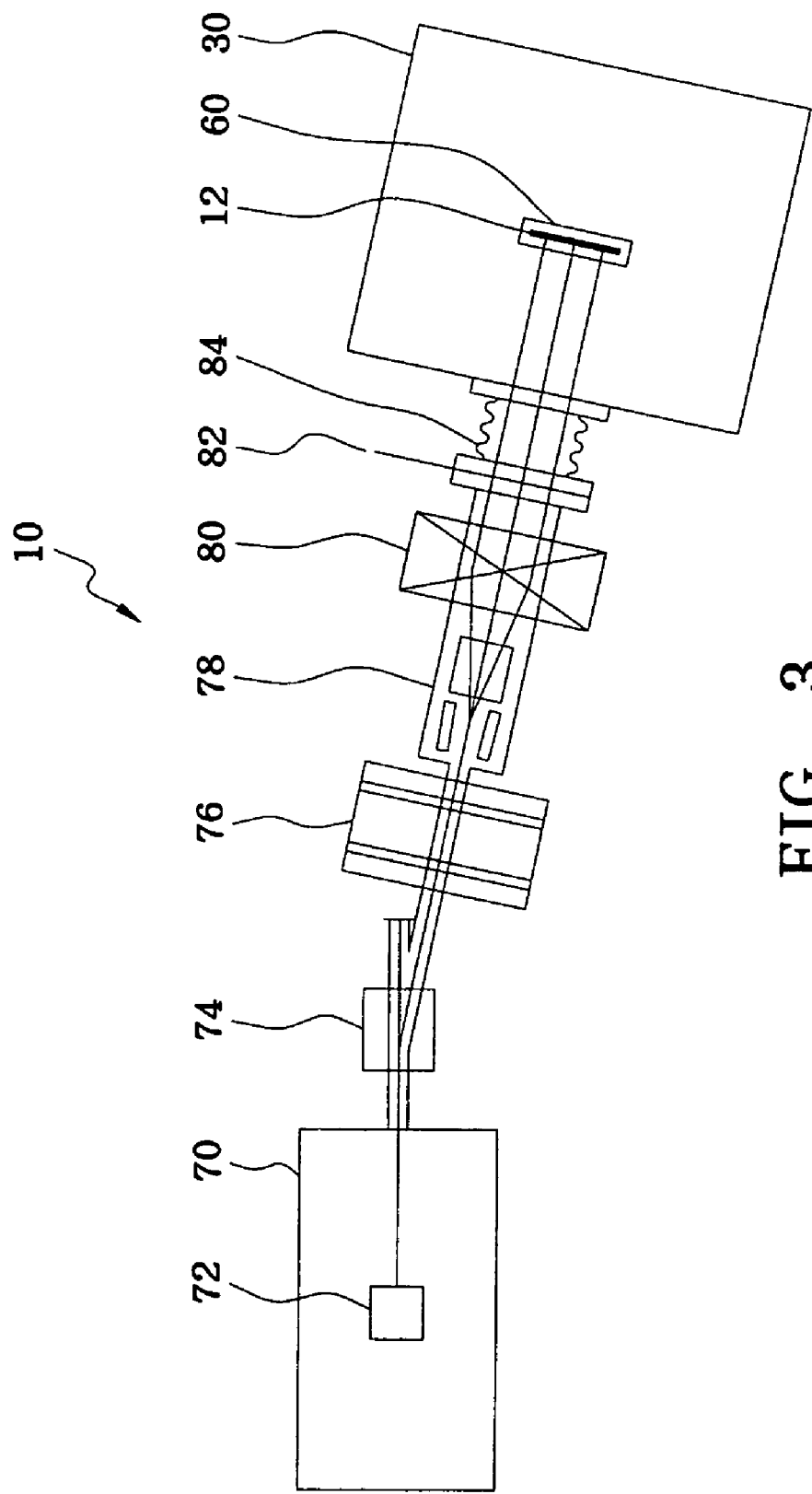
FIG. 3 is a schematic view diagram of an ion implanting apparatus according to the present invention.

FIG. 3 is a schematic view diagram of the ion implanting apparatus 10 according to the present invention. As shown in FIG. 3, the ion implanting apparatus 10 comprises an ion generator 70, a mass analysis magnet 74 positioned between the implanting chamber 30 and the ion generator 70, a first multipole moment magnet 76 positioned between the mass analysis magnet 74 and the implanting chamber 30, a deflection board 78 positioned between the first multipole moment magnet 76 and the implanting chamber 30, and a second multipole moment magnet 80 positioned between the deflection board 78 and the implanting chamber 30. The second multipole moment magnet 80 is a quadrupole moment magnet for adjusting the direction of the ion beam in order to be perpendicular to the surface of the wafer 12.

The ion generator 70 comprises an ion source bottle 72 capable of generating ions, wherein the ion source bottle 72 uses the high frequency oscillation to ionize the dopant to be added into the wafer 12. For instance, it may ionize hydrogen gas, oxygen gas and nitrogen gas into proton, oxygen ion and nitrogen ion, respectively. The generated ions are pulled out from the ion source bottle 72 by an external high voltage, and the desired specie of ion with certain energy is sieved out to form the ion beam by an accelerating electrode and the mass analysis magnet 74. The first multipole moment magnet 76, such as a quadrupole moment magnet, is used to adjust the cross-sectional area and the current density of the ion beam to avoid the occurrence of diffusion phenomena due to the collisions between the ions.

The ion beam is deflected by the deflection board 78 with adjustable voltage to irradiate onto the wafer 12 inside the implanting chamber 30. The deflection board 78 comprises a pair of parallel and vertical deflection plates for adjusting of the direction of the ion beam. The direction of the ion beam is not substantially perpendicular to the surface of the wafer 12 even after the adjustment of the deflection board 78. In addition, only some certain regions of the wafer 12 is required to perform the ion implanting, and a photoresist with a predetermined thickness covers the regions as a hard mask for the ion beam. As a result, problems such as slanting irradiation or irradiation shadow may emerge. In order to overcome this problem, the second multipole moment magnet 80 is installed at the exit of the deflection board 78 to adjust the direction of the ion beam with a divergent angle to be perpendicular to the surface of the wafer 12 according to the present invention.

The second multipole moment magnet 80 can generate a magnetic field with aggregating action. For instance, when an ion beam passes through a magnetic field with certain magnetic intensity in a non-parallel manner, the ion beam will be deflected by a force (F), which can be expressed by the following formula:

$$F = qvB \sin \theta$$

Wherein "q" represents the electric charge of the ion, "v" represents the velocity of the ion, "B" represents the magnetic intensity, and "θ" represents the included angle between the ion movement direction and magnetic field direction. The force is perpendicular to the surface of v, and is able to control the direction of the ion beam without changing its speed. Therefore, the second multi-pole moment magnet is able to adjust the direction of the ion beam to be perpendicular to the surface of the wafer 12 to eliminate the slanting irradiation and the irradiation shadow originating from the divergent angle of the ion beam.

In addition, a gated vacuum valve 82 is positioned between the implanting chamber 30 and the ion generator 70 according to the present invention, so that the vacuum state of the implanting chamber 30 can be kept effectively and the ion beam from the ion generator 70 can be blocked temporarily on replacing the wafer cassette 20 or maintaining the ion implanting apparatus 10. Preferably, the gated vacuum valve 82 is positioned between the implanting chamber 30 and the second multipole moment magnet 80. Furthermore, an extension tube 84 is positioned between the implanting chamber 30 and the ion generator 70 for buffering and reducing the mutual influence due to mechanical vibration and device maintenance. The extension tube 84 is preferably positioned between the implanting chamber 30 and the gated vacuum valve 82.

The ion implanting apparatus 10 further comprises a quartz glass window 32 positioned behind the implanting base 60 (referring to FIG. 1). A visible blue light is generated when the ion beam bombards on the quartz material, therefore the irradiation position of the ion beam can be observed in advance and can be adjusted through adjusting the deflection voltage of the deflection board 78. After that, the wafer-transferring module 50 is used to push up the irradiation tray 22 to the implanting base 60 for performing the ion implanting process.

According to the present invention, a computer system may be adopted to control the ion implanting apparatus 10 to achieve automatic ion implanting. For instance, after the wafer cassette 20 with the wafer 12 is placed in the guiding chute 46, the computer system shall transmit a control instruction to the first stepping motor 44 of the cassette-transferring module 40. The first stepping motor 44 rotates the gear 42 to drive the rack 24, which moves the wafer cassette 20 on the guiding sliding chute 46 until the first irradiation tray 22 of the wafer cassette 20 is right above the push plate 52. The computer system shall then transmit a control instruction to the second stepping motor 54 of the wafer-transferring module 50 to drive the push plate 52, which moves the irradiation try 22 upward to the implanting base 60.

The computer system transmits a control instruction to open the gated vacuum valve 82 so that the ion beam can irradiate on the wafer 12 loaded in the irradiation tray 22. After the ion implanting process is completed, the computer system transmit a control instruction to close the gated vacuum valve 82, while the second stepping motor 54 drives the push plate 52 to move the first radiation tray 22 downward to the wafer cassette 22. After that, the computer system transmit a control instruction to the first stepping motor 44 to move the wafer cassette 20 forward a unit distance, and repeat the aforementioned procedures to complete the ion implanting of the wafer 12 in the wafer cassette 20.

Compared with prior arts, the present invention possesses the following advantages:

1. The ion implanting apparatus 10 of the present invention makes the ion beam perpendicular to the surface of the wafer 12 by making use of the second multipole moment magnet 80, so that the purpose of uniform implanting can be achieved by eliminating the slanting irradiation and the irradiation shadow originating from the divergent angle of the ion beam.
2. With the design for the wafer cassette 20, the cassette-transferring module 40 and the wafer-transferring module 50, the ion implanting apparatus 10 of the present invention can cooperate with a computer system to fulfill an automatic ion implanting.
3. The number of wafers implanted in a single batch depends on the capacity of the wafer cassette 20, rather than the size of the implanting chamber 30, and therefore the implanting chamber for the present ion implanting apparatus can be designed to be smaller as compared with the prior art. In addition, the design for both the cassette-transferring module 40 and the wafer-transferring module 50 is also simpler as compared with the prior art.

The above-described embodiments of the present invention are intended to be illustrative only. Numerous alternative embodiments may be devised by those skilled in the art without departing from the scope of the following claims.

We claim:

1. An ion implanting apparatus comprising:
   a wafer cassette means for loading a plurality of irradiation trays for loading wafers;
   an implanting chamber including an implanting base having a two guiding pillars with a guiding trench means for guiding the irradiation tray;
   a current integrator electrically connected to said implanting base;
   an insulative sleeve having a guiding slot, said two guiding pillars being positioned at two sides of said guiding slot;
   a cassette-transforming means for moving said wafer cassette means to a predetermined position; and
   a wafer-transferring means for moving the wafer from said wafer cassette means to said implanting base.

2. The ion implanting apparatus of claim 1, wherein the cassette-transferring means comprises:
   a rack positioned on the wafer cassette means;
   a gear drivingly connected to the rack through rotation so as to move the wafer cassette means forward; and
   a first stepping motor means for driving said gear.

3. The ion implanting apparatus of claim 2, wherein said cassette-transferring means further comprises a guiding chute means for guiding a moving direction of said wafer cassette means.

4. The ion implanting apparatus of claim 1, wherein said wafer-transferring means comprises:
   a push plate means for moving the wafer from said wafer cassette means to said implanting base; and
   a second stepping motor means for driving the push plate means.

5. The ion implanting apparatus of claim 1, further comprising:
   an ion generator means for generating an ion beam;
   a mass analysis magnet positioned between said implanting chamber and said ion generator means;
   a first multipole moment magnet positioned between said mass analysis magnet and said implanting chamber;
   a deflection board positioned between said first multipole moment magnet and said implanting chamber; and
   a second multipole moment magnet positioned between said deflection board and said implanting chamber.

6. The ion implanting apparatus of claim 5, wherein said second multipole moment magnet is a quadrupole moment magnet means for adjusting the direction of the ion beam to be perpendicular to the surface of the wafer.

7. The ion implanting apparatus of claim 5, further comprising:
   a gated vacuum valve positioned between said implanting chamber and said ion generator means; and
   an extension tube positioned between said implanting chamber and said gated vacuum valve.

* * * * *